United States Patent [19]

Wyszynski

[11] Patent Number: 5,608,665
[45] Date of Patent: Mar. 4, 1997

[54] SELF-TUNED, CONTINUOUS-TIME ACTIVE FILTER

[76] Inventor: Adam S. Wyszynski, 801 Legacy Dr., #918, Plano, Tex. 75023

[21] Appl. No.: 538,591

[22] Filed: Oct. 3, 1995

[51] Int. Cl.$^6$ .............................. G06G 7/02; G06F 15/31
[52] U.S. Cl. ........................... 364/825; 364/724.01
[58] Field of Search ............................ 364/825, 724.01, 364/724.16

[56] References Cited

U.S. PATENT DOCUMENTS

| | | | |
|---|---|---|---|
| 3,421,141 | 1/1969 | Meyerhoff | 340/15.5 |
| 3,617,924 | 11/1971 | Fujita et al. | 331/70 |
| 3,792,367 | 2/1974 | Fleischer et al. | 330/98 |
| 3,978,420 | 8/1976 | Lane | 330/107 |
| 3,979,684 | 9/1976 | Acker | 328/167 |
| 4,257,018 | 3/1981 | Masdea et al. | 333/17 R |
| 4,302,738 | 11/1981 | Cabot et al. | 333/174 |
| 4,918,338 | 4/1990 | Wong | 307/521 |
| 4,933,644 | 6/1990 | Fattaruso et al. | 330/258 |
| 4,952,891 | 8/1990 | Moulding | 333/17.1 |
| 5,051,628 | 9/1991 | Hanna | 307/520 |
| 5,063,309 | 11/1991 | Yamasaki | 307/521 |
| 5,179,727 | 1/1993 | Imagawa | 455/182.3 |
| 5,187,445 | 2/1993 | Jackson | 328/167 |
| 5,235,294 | 8/1993 | Ishikawa et al. | 333/17.1 |
| 5,276,409 | 1/1994 | Parikh et al. | 333/17.1 |
| 5,281,911 | 1/1994 | Bailey et al. | 333/17.1 |
| 5,283,483 | 2/1994 | Labor et al. | 307/520 |
| 5,345,119 | 9/1994 | Khoury | 307/521 |
| 5,345,190 | 9/1994 | Kaylor | 330/258 |
| 5,502,662 | 3/1996 | Lyon | 364/724.01 |
| 5,525,928 | 6/1996 | Asakawa | 327/552 |
| 5,568,142 | 10/1996 | Velazquez et al. | 341/126 |

Primary Examiner—Tan V. Mai
Attorney, Agent, or Firm—Ross, Clapp, Korn & Montgomery, L.L.P.

[57] ABSTRACT

A self-tuned, continuous-time active filter receives a differential input signal and generates a differential output signal. The filter consists of cascaded first-order and second-order tunable filter sections. All filter sections are tuned: some filter sections are indirectly-tuned using the tuning signals from directly-tuned filter sections to control pole frequencies and Q-factors. The filter is equipped with at least one directly-tuned section that consists of a pair of identical first- or second-order sections that simultaneously receive a differential reference signal and the differential input signal. Each directly-tuned section generates a low-pass output signal and may generate a band-pass output signal.

19 Claims, 8 Drawing Sheets

SELF-TUNED, CONTINUOUS-TIME ACTIVE FILTER

TECHNICAL FIELD OF THE INVENTION

The present invention relates to electronic filter circuits, and more particularly to a self-tuned, continuous-time active differential filter equipped with frequency and Q-factor tuning schemes. The filter simultaneously operates on the main signal and the reference signal both conditioned in such a way that the reference is not seen at the main signal output and the main signal is not seen at the reference output.

BACKGROUND OF THE INVENTION

Due to unavoidable process tolerances, continuous-time integrated filters must be tuned, because their pole-frequencies are set by ratios of two technologically independent parameters: transconductance $g_m$ in $g_m$-C filters, conductance $g_{ds}$ in MOSFET-C filters, or resistance R in active R-C filters, and capacitance C. Process variations cause $g_m/C$, $g_{ds}/C$, and $1/(RC)$ ratios to change up to 30–50%. Additionally, the temperature variation may cause excessive variation of $g_m$ or $g_{ds}$ up to and above 100% depending on the temperature operating range, the technology, and the design of a particular filter. Similarly, phase shifts of amplifiers, that filter integrators are built with, must be compensated even for moderate values of quality-factor (Q), if the filter specifications are to be correctly realized. This compensation becomes particularly important in high-Q filters, where the effects of phase shifts for a transfer function are very detrimental and may lead to instability of a filter.

In many practical applications it is desirable that both frequency- and Q-tuning are performed when the filter is in operation, with the main signal applied. As a consequence, Master-Slave tuning schemes have been implemented, in which errors in frequency and Q of Master designed as a partial replica of the main filter (Slave) are measured and corrections are applied to both the Master and Slave. The pole-frequencies and Q's of Slave filter sections is controlled by Master filter or by Master oscillator, both referred to an accurate frequency and amplitude reference. Total filter accuracy is maintained by continuously applying the frequency reference. The main disadvantage of Master-Slave method is the fact that errors are measured in a filter that is different from the tuned one. The accuracy of Master-Slave method is only as good as the matching between Master and Slave limited by on-chip component matching and, especially, by simplifications of Master structure with respect to Slave.

A need has thus arisen for a filter that provides for direct and accurate on-line tuning, and that does not depend on the accuracy of the matching between Master and Slave.

SUMMARY OF THE INVENTION

In accordance with the present invention, a self-tuned, continuous-time filter is provided. The filter receives a differential input signal and generates a differential output signal. The filter is built as cascade of first-order and second-order tunable filter sections. A filter section can be directly-tuned by applying to its inputs a separate reference signal, next by extracting this reference at the section output, and then by using the extracted reference by separate tuning systems that generate correction signals applied back to the tuned section. Alternatively, a filter section can be indirectly-tuned by using correction signals derived by the frequency- and Q-tuning schemes of a directly-tuned section and by relying on good matching between both filter sections. The sequence of directly- and indirectly-tuned sections is determined by the filter transfer function, the required tuning accuracy, and the condition to maximize the realizable dynamic range.

Each directly-tuned filter section consists of two identical blocks and receives a differential reference signal and a differential input signal. Two distinct methods of applying the reference and the main signal are utilized. In a first filter called Type 1, a pair of differential signals is applied in anti-phase and the differential reference is simultaneously applied in-phase to the inputs of the two identical blocks. The reference is recovered by summing the differential output signals of the two identical blocks, and the main signal is recovered by subtracting the differential output signals of the two identical blocks. In a second filter called Type 2, differential signals are applied in-phase and the reference is simultaneously applied in anti-phase to the inputs of the two identical blocks. The reference is recovered by subtracting the differential output signals of the two identical blocks, and the signal is recovered by summing the differential output signals of the two identical blocks.

Each directly-tuned second-order filter section generates a low-pass output signal and a band-pass output signal. Circuitry is provided for summing (for Type 1) or subtracting (for Type 2) the low-pass output signals of the directly-tuned filter sections and for generating correction signals applied to the filter sections for frequency tuning. First-order filter sections can also be directly tuned. With their one-pole transfer functions no Q-tuning is involved, hence the frequency-tuning is performed only.

Circuitry is further provided for summing (for Type 1) or subtracting (for Type 2) the band-pass output signals of the directly-tuned filter sections and for generating correction signals applied to the filter sections for Q-tuning of the filter sections.

Additional circuitry is provided for subtracting (for Type 1) or summing (for Type 2) the differential signal outputs to remove the reference signals from the outputs of the filter section.

The block arrangements used in self-tuned filters involving two or more, identical or scaled blocks, actually using or not using self-tuning, applying differential input signals in phase (for Type 1), or in anti-phase (for Type 2) may result in increased output signal level, improved linearity and extended linear range of the resulting filter section. Any types of active building blocks obey this general rule. In particular, using Type 1 input signals for two identical blocks built with differential input, single-ended output amplifiers results in doubling the output, as well as in substantial improved linearity and in extended linear range.

In the case when the filter consists of many directly-tuned sections, separate reference generators and separate tuning schemes for each directly-tuned filter section can be avoided by sharing one programmable reference and one set of frequency- and Q-tuning schemes, and by using multiplexing schemes and tuning-signal holds. In such a case, the reference is periodically reprogrammed to the tuning-frequency of the next directly-tuned section and applied through the reference multiplexer to the inputs of the appropriate directly-tuned section. After passing through the directly-tuned filter section, the reference recovered by a summing circuit (for Type 1) or a subtracting circuit (for Type 2) is multiplexed to the appropriate tuning scheme. As the result, the tuning signal is fed back to the original directly-tuned filter section. Since the tuning-signal holds are provided, the tuning signal is maintained constant during the period when next sections are being tuned.

Another aspect of the present invention is to use a self-tuned filter to perform tuning in a wafer sort-trim stage of fabrication. In such a case the major part of the tuning circuitry may be external to the chip as a part of a test setup, and it can be shared by different tuned sections using multiplexers. During wafer sort-trim, each of the directly-tuned sections of the self-tuned filter is tuned and the corrections to the filter in terms of tuning-signals or elements values are permanently trimmed into the chip. The tuning continues until all directly-tuned sections are tuned and trimmed. No internal switches are necessary to reconfigure the filter for tuning and trimming.

Yet another aspect of the present invention is to use a self-tuned filter to perform tuning during a period when the filter can be taken out of the system. The advantage of self-tuning for this application is that each of the sections can be separately and accurately tuned and that again no switches are necessary to reconfigure the filter to perform tuning.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
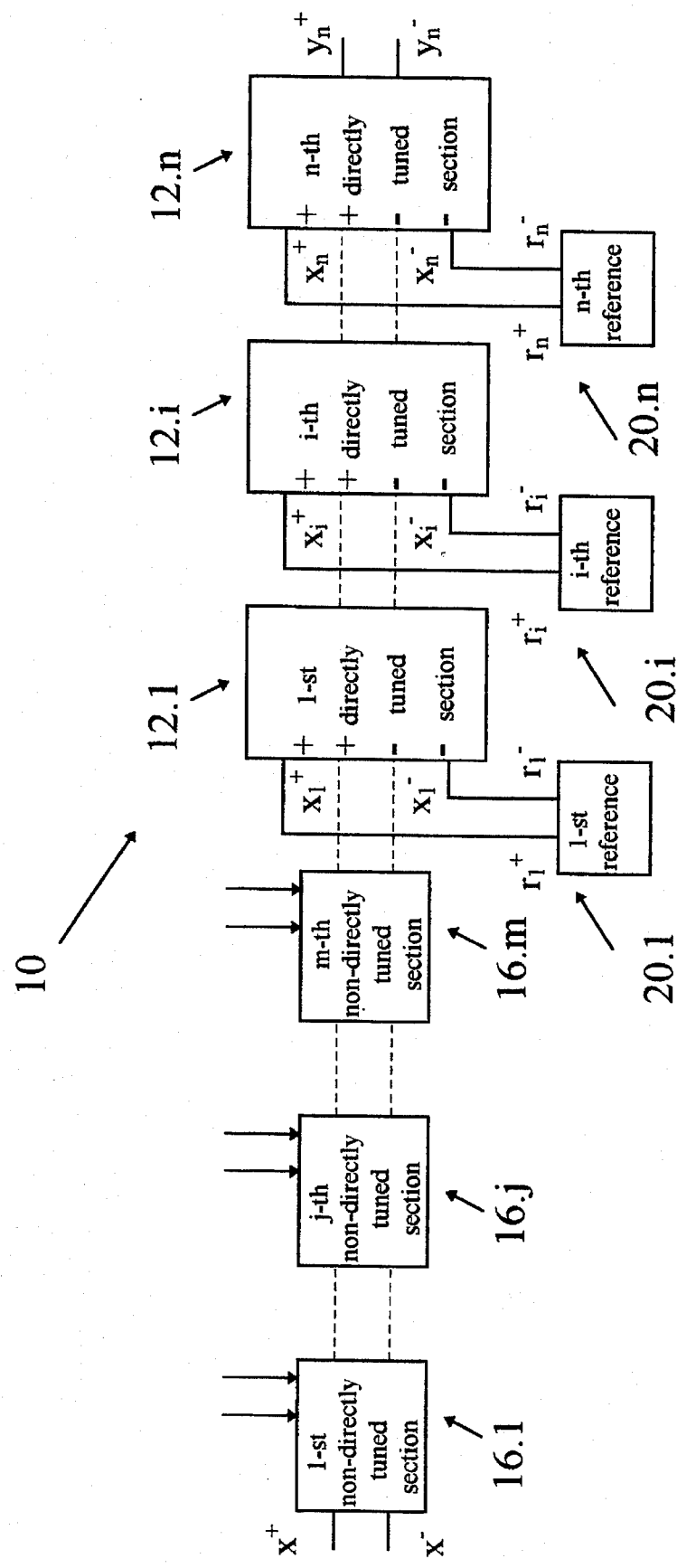
FIG. 1 is a block diagram of the present filter.

Referring to the FIG. 1, the present self-tuned, continuous-time active filter is illustrated in block diagram form, and is generally identified by the numeral 10. The present filter 10 operates so that reference signals and main signals are applied simultaneously to 2 n (n is an integer number) tuned-sections $12.i$ (i is an integer number, and $1<i<n$) of filter 10 and are readily separated at their outputs. The reference signals are not present at the signal output of the tuned-sections, and the main signal is not seen at the tuning output of the tuned-sections. The present invention does not use Master-Slave approach, but a differential reference is applied directly to the inputs of each tuned section instead. Each filter section $12.i$ receives a differential main input signal $(x^+_i, x^-_i)$ either from one of m (m is an integer number) non-tuned filter section $16.j$ (j is an integer number, $1<j<m$), or the combined output of the preceding tuned sections $12.i$-1. Non-tuned filter sections $16.j$ receive frequency and Q-tuning signals from one or more directly-tuned sections. The order of the tuned sections may differ from that show in FIG. 1, such as the non-tuned sections can follow tuned sections, or both types can be intermixed.

Figure 2:
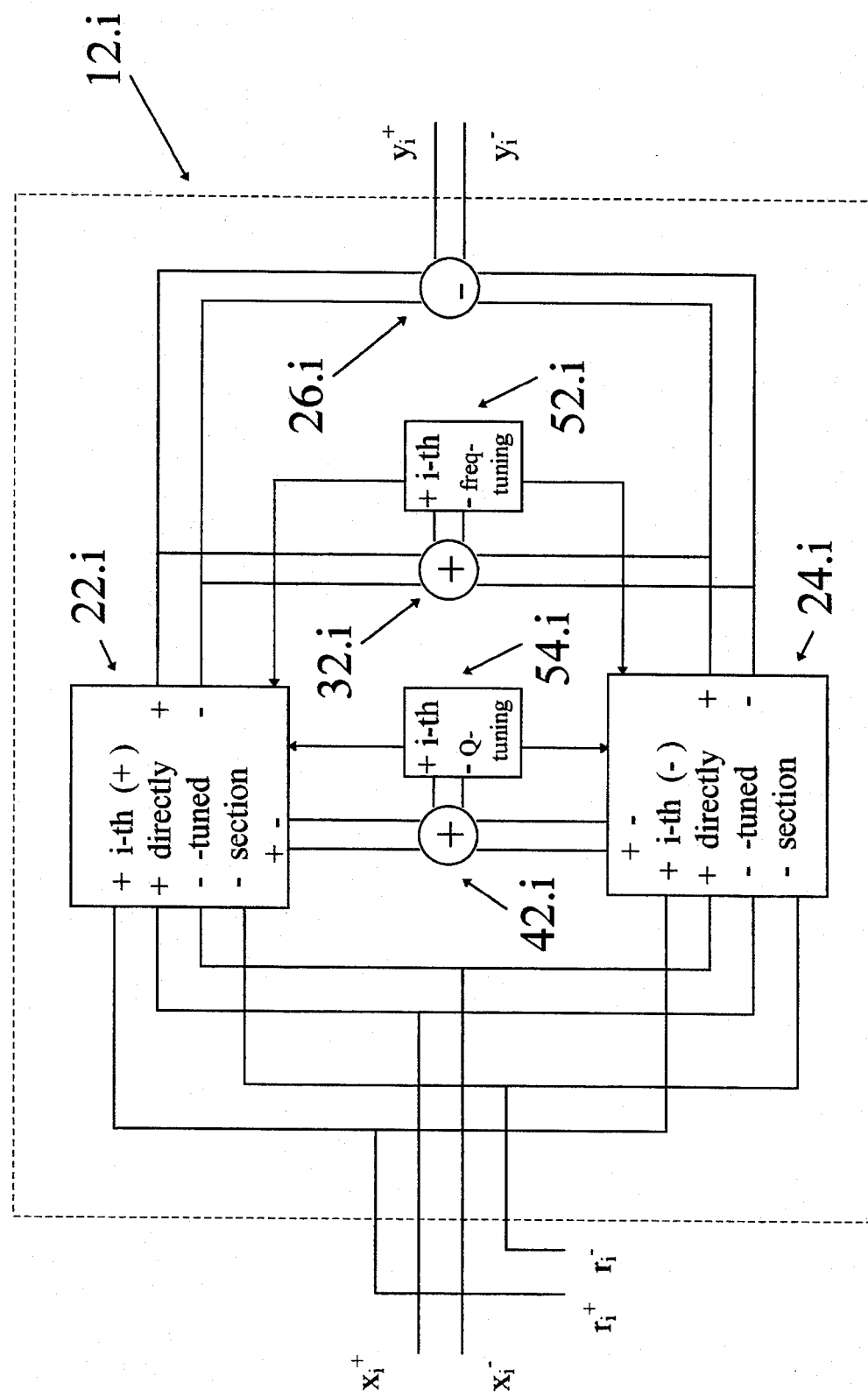
FIG. 2 is a block diagram of the present filter in which the main signal is applied in anti-phase and the reference is applied in-phase.
Figure 3:
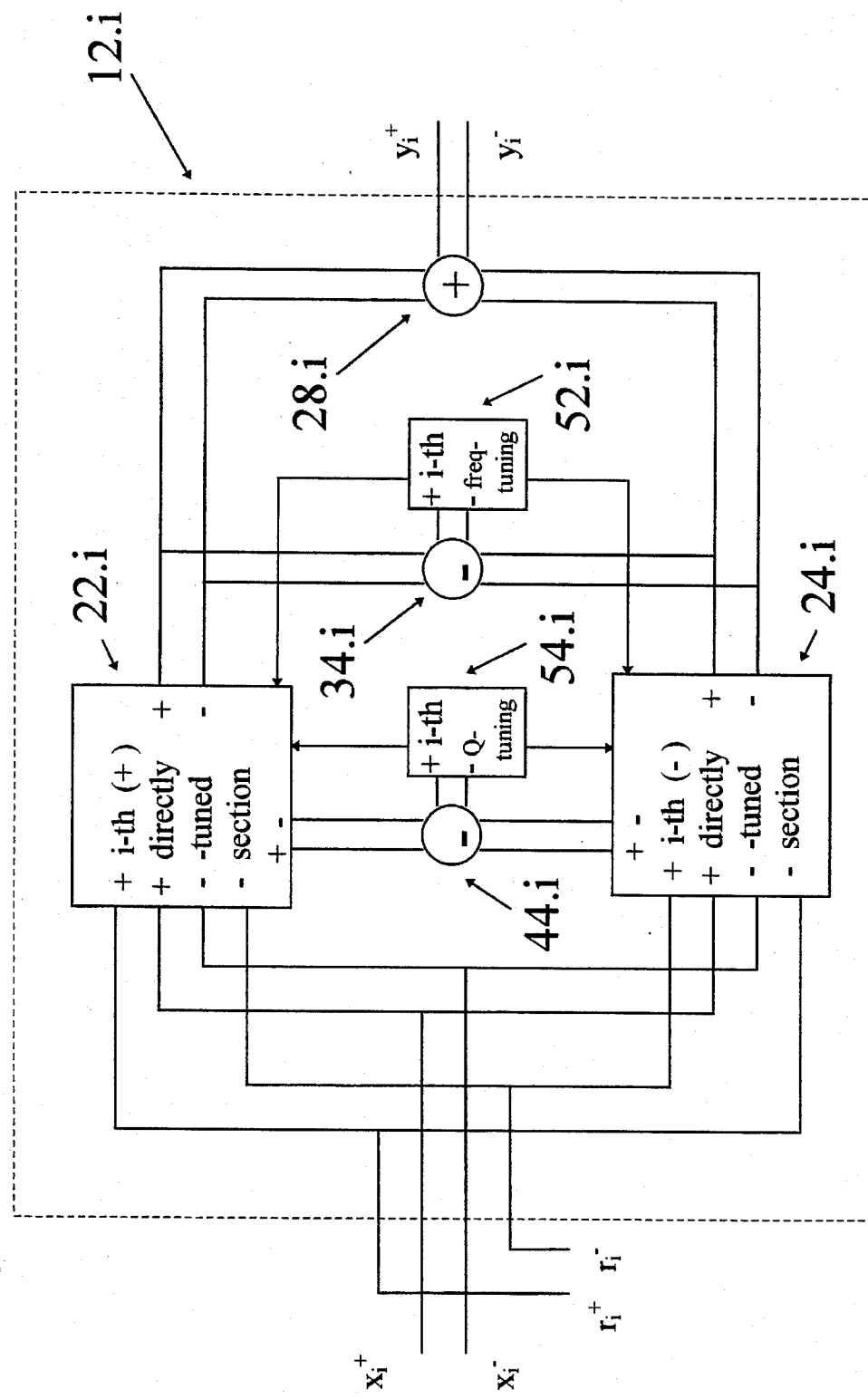
FIG. 3 is a block diagram of the present filter in which the main signal is applied in-phase and the reference is applied in anti-phase.

As illustrated in FIG. 2 for Type 1 signal arrangement, the input signals are applied to filter sections $22.i$ and $24.i$ in anti-phase and the reference is applied in-phase. As illustrated in FIG. 3 for Type 2 signal arrangement, the input signals are applied to filter sections $22.i$ and $24.i$ in-phase and the reference is applied in anti-phase.

An important aspect of the present invention shown in FIG. 1 is the simultaneous use by each tuned-section $12.i$ of the main signal, and the reference signals provided by a separate reference source $20.i$ that generates a differential reference signal $(r^+_i, r^-_i)$. Reference source $20.i$ generates, for example, a one tone sinusoidal signal, and may comprise, for example, a crystal oscillator and/or a frequency synthesizer. Filter sections $22.i$ and $24.i$ have non-inverting inputs (+) and inverting inputs (−) as shown in FIG. 2 for the reference signals applied in-phase (Type 1), and in FIG. 3 for the reference signals applied in anti-phase (Type 2).

Each tuned-section $22.i$ and $24.i$ generates low-pass (LP) output signals applied to a separate summing circuit $32.i$ in FIG. 2 (for Type 1), or subtracting circuit $34.i$ in FIG. 3 (for Type 2). The output of summing circuit $32.i$ or subtracting circuit $34.i$ generates Virf+ and Virf− signals applied to a separate frequency tuning circuit $52.i$. Frequency tuning circuit $52.i$ generates frequency correction signals applied to filter sections $22.i$ and $24.i$. Frequency tuning circuit $52.i$ may include, for example, a frequency reference, a phase-lock loop containing a digital phase-detector and a low-pass loop-filter. The reference signal passes through filters $22.i$ and $24.i$ and is compared with the original reference by the phase-detector within frequency tuning circuit $52.i$. Both signals are kept in quadrature as the output of the phase detector is low-pass filtered and applied as a bias voltage to filters $22.i$ and $24.i$ to control the value of $g_m$ and thereby the frequency of filters $22.i$ and $24.i$.

Band-pass output signals of each tuned-sections $22.i$ and $24.i$ are applied to a summing circuit $42.i$ in FIG. 2 (for Type 1), or to a subtracting circuit $44.i$ in FIG. 3 (for Type 2). Circuits $42.i$ and $44.i$ generate the Virq+ and Virq− signals applied to a separate Q-tuning circuit $54.i$. The Q-factor is adjusted using the same reference signals by an amplitude-detection loop consisting of a reference amplifier, two peak-detectors and a differential amplifier within Q-tuning circuit $54.i$. The differential amplifier is used to compare the amplitude of the reference output with that of the pure reference, and to control the Q of the filter until both amplitudes are equal. The reference signal is amplified by the tuned-sections $22.i$ and $24.i$ at their reference frequency to approximately Q-times the reference.

Summing circuit $26.i$ in FIG. 2 (Type 1) and a subtracting circuit $28.i$ in FIG. 3 (Type 2) operate to cancel the main signals so that only the reference signals are processed by tuning circuits $52.i$ and $54.i$.

An advantage of the present filter is that the reference frequency can be chosen where the tuning-sections $22.i$ and $24.i$ have their highest sensitivity to frequency- and Q-variations, i.e., at their pole frequency. In the filter, the reference signals can be further attenuated by other trailing non-directly tuned sections. In addition, the pole frequency of the tunable-sections $22.i$ and $24.i$ may fall into the stop-band of the filter where residual reference components are of less concern.

As previously stated, the output of filter 10 is obtained by taking the difference or the sum of the output signals of section $12.i$ at a subtraction circuit $26.i$ (for Type 1 in FIG. 2) or summation circuit $28.i$ (for Type 2 in FIG. 3) that results in elimination of the reference signal. The output of filter 10 is a differential output ($y^+$, $y^-$).

Filter 10 in FIG. 1 operates such that the resulting transfer functions of tunable-sections $22.i$ and $24.i$ in FIGS. 2 and 3 forming a section $12.i$ in FIG. 1 for the reference signal and the main signal are the same. If the higher accuracy of the transfer function is required, filter 10 may contain several pairs of tunable-sections $12.i$ replacing non-tunable sections such as $16.j$ in FIGS. 1. The reference and main signals are separated at the output of filter 10, thereby allowing filter 10 to use the reference signal to be compared with its own image after passing through filter 10. Amplitude and frequency can be continuously adjusted based upon the reference signal. The filter input signal and the reference signal of the system are applied in such a way that at the filter output of the system, the output signal is recovered containing only a small residuum of the reference signal.

Figures 4A, 4B:
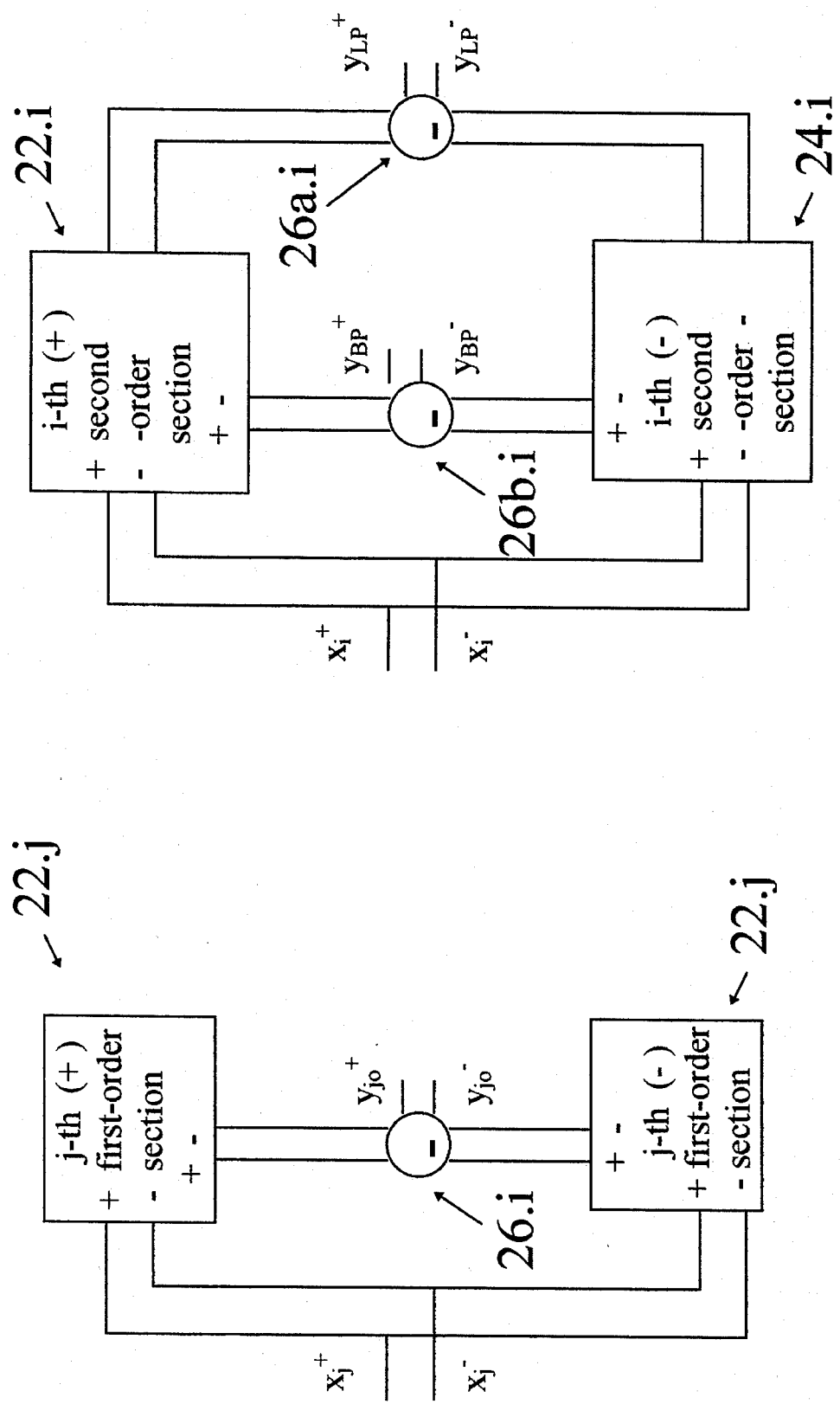
FIG. 4a is a block diagram of a self-tuned first-order filter of the present invention.
FIG. 4b is a block diagram of a self-tuned second-order filter of the present invention.
Figures 5A, 5B:
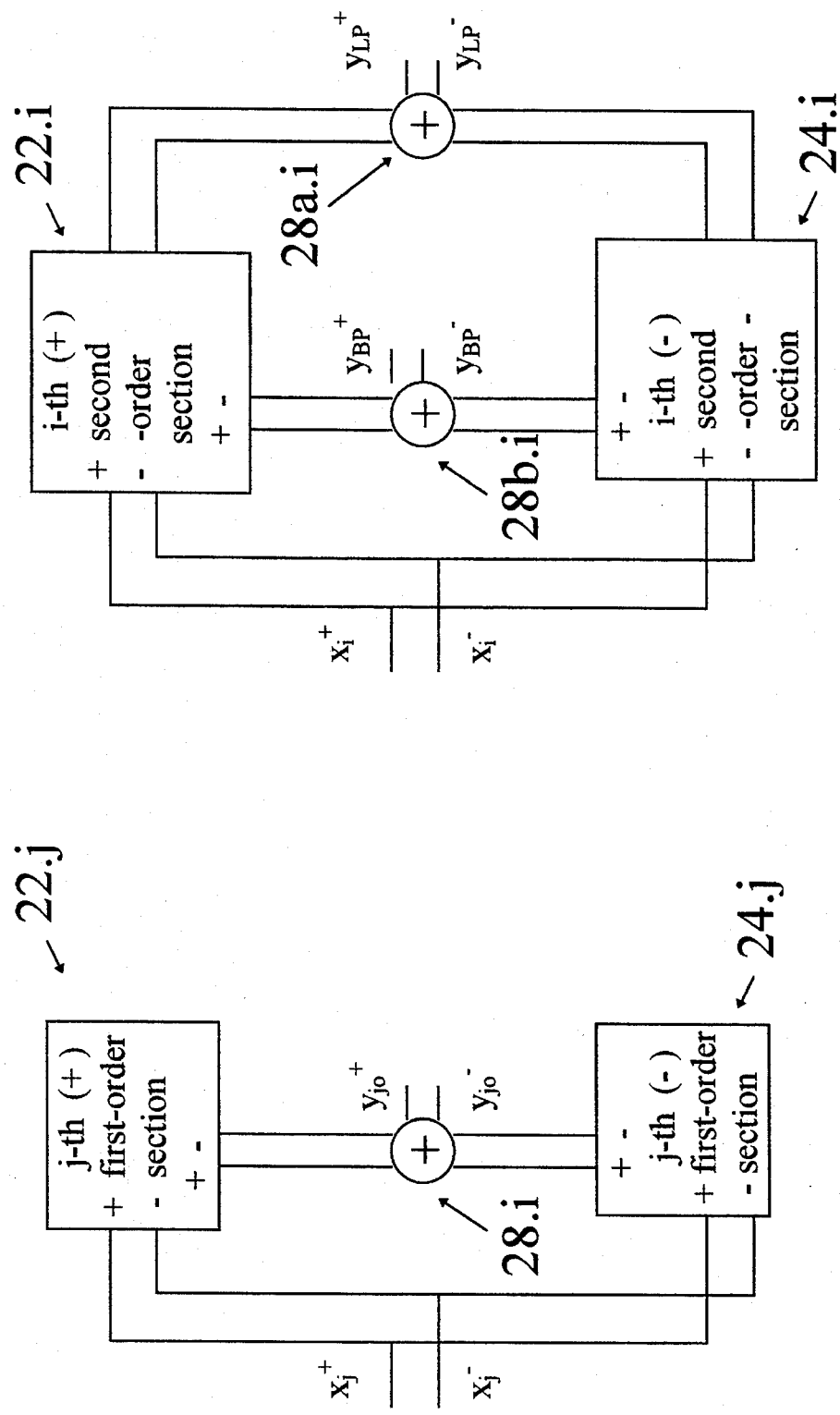
FIG. 5a is a block diagram of a self-tuned first-order filter of the present invention.
FIG. 5b is a block diagram of a self-tuned second-order filter of the present invention.

The filter arrangements used in self-tuned filters involving two or more, identical or scaled blocks, being actually self-tuned or being not self-tuned, applying differential input signals in anti-phase and subtraction by subtractor $26.i$ (Type 1 in FIG. 4a) or subtractors $26a.i$ and $26b.i$ (Type 1 in FIG. 4b), or in phase and addition by adder $28.i$ (Type 2 in FIG. 5a) or adders $28a.i$ and $28b.i$ (Type 2 in FIG. 5b) may yield increased output signal level, improved linearity and extended linear range of the resulting filter section. Any types of first-order ($22.j$ and $24.j$), or second-order ($22.i$ and $24.i$) active building blocks obey this general rule. In particular, using Type 1 input signals for two identical blocks built with differential input and single-ended output amplifiers results in doubling the output, as well as in substantial improved linearity and in extended linear range.

Figure 6:
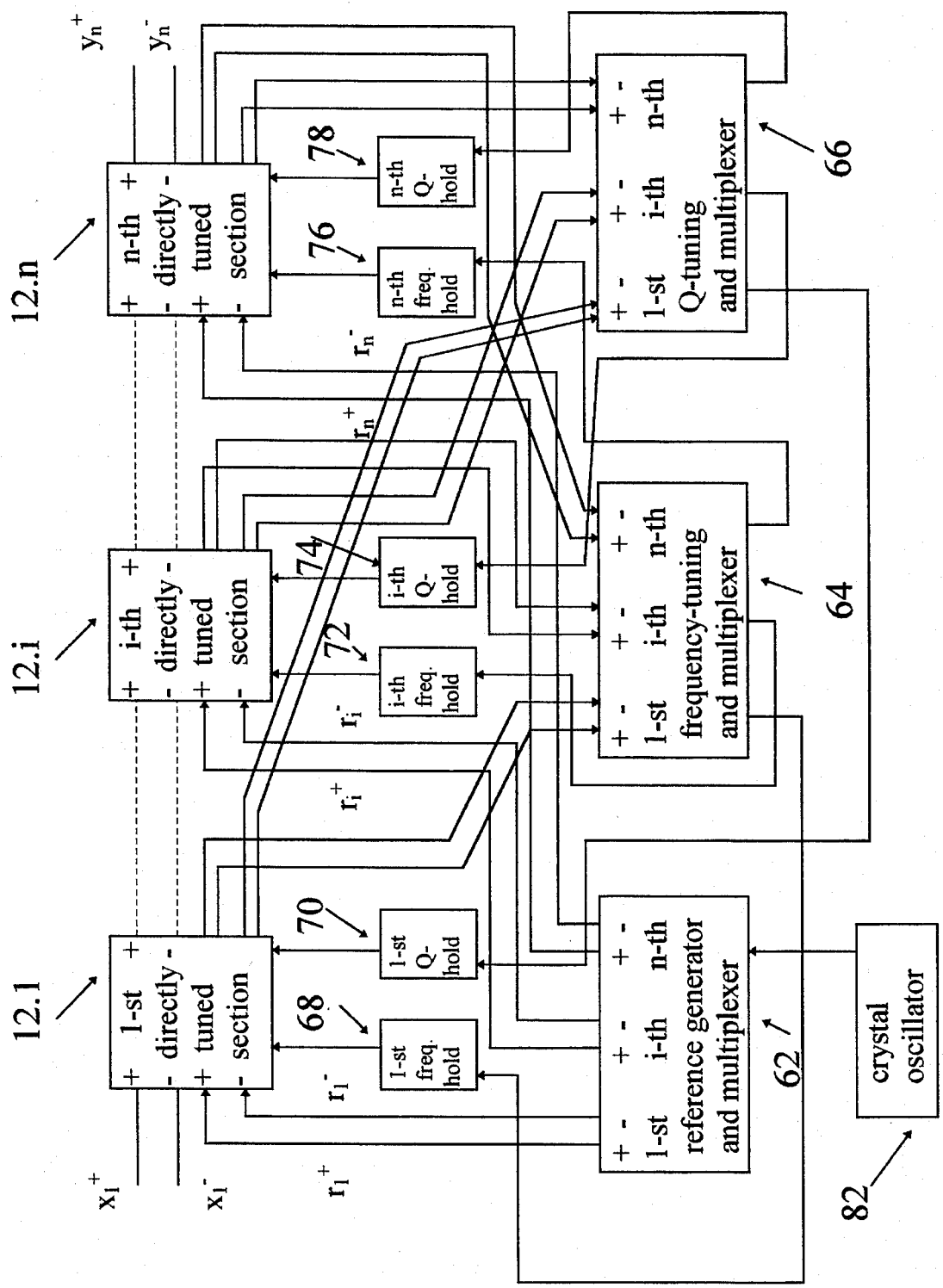
FIG. 6 is a block diagram of a self-tuned filter arrangement of the present invention using multiple tuned sections.

In the case when a filter consists of many directly-tuned sections, as shown in FIG. 6, in accordance with the present invention, separate reference generators and separate tuning schemes for each directly-tuned filter section can be avoided by sharing one programmable reference 62, one frequency-tuning scheme 64, and one Q-tuning scheme 66. This arrangement is performed by multiplexing schemes present in each of blocks 62, 64 and 66, as well as by tuning-signal holds 68, 70, 72, 74, 76, 78. During the filter operation, the reference is periodically reprogrammed to the tuning-frequency of the next directly-tuned section $12.i$ and applied through the reference multiplexer of reference 62 to its inputs. After passing through the directly-tuned filter section, the reference recovered at the low-pass output by a summing (for Type 1), or a subtracting (for Type 2) circuit (inside block $12.i$) is multiplexed to the frequency-tuning scheme 64. The frequency-tuning signal derived by scheme 64 is multiplexed back to the directly-tuned section $12.i$ through the frequency-tuning hold 72. Similarly, the reference recovered at the band-pass output by a summing circuit (for Type 1), or a subtracting circuit (for Type 2) (inside block $12.i$) is multiplexed to the frequency-tuning scheme 66. The Q-tuning signal derived by scheme 66 is multiplexed back to the directly-tuned section $12.i$ through the frequency-tuning hold 74. As the result, the tuning signal is fed back to the original directly-tuned filter section. Since the tuning-signal holds are provided, the tuning signal does not change when the next sections are being tuned. An off-chip crystal oscillator 82 provides timing input to reference 62.

Figure 7:
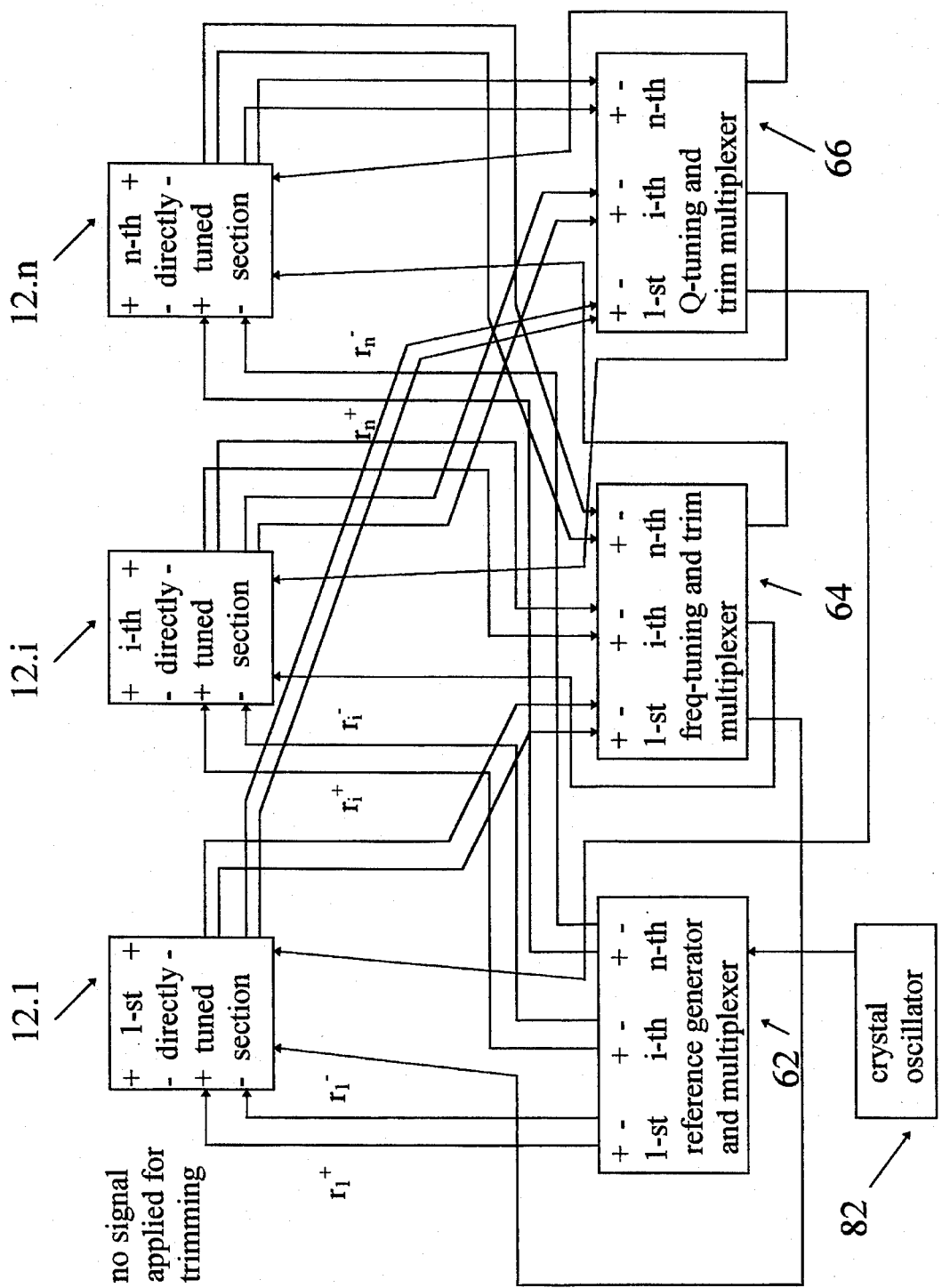
FIG. 7 is a block diagram of a filter arrangement of the present invention used for wafer-sort and trim.

Another aspect of the present invention for a self-tuned filter is to perform its tuning in a wafer sort-trim stage as illustrated in FIG. 7. The general configuration of the filter is similar to the filter of FIG. 6 with sharing the reference 62 and tuning schemes 64 and 66 by all tuned sections, and using multiplexers. In case of the trim, the major part of the tuning circuitry may be external to the chip as a part of a test setup, and it can be shared by different tuned sections using multiplexers. During wafer sort-trim, each of the directly-tuned sections $12.i$ of the self-tune filter is tuned and the corrections to the filter in terms of tuning-signals or elements values are permanently trimmed into the chip. The tuning continues until all directly-tuned sections are tuned and trimmed. No internal switches are necessary to reconfigure the filter for tuning and trimming.

Figure 8:
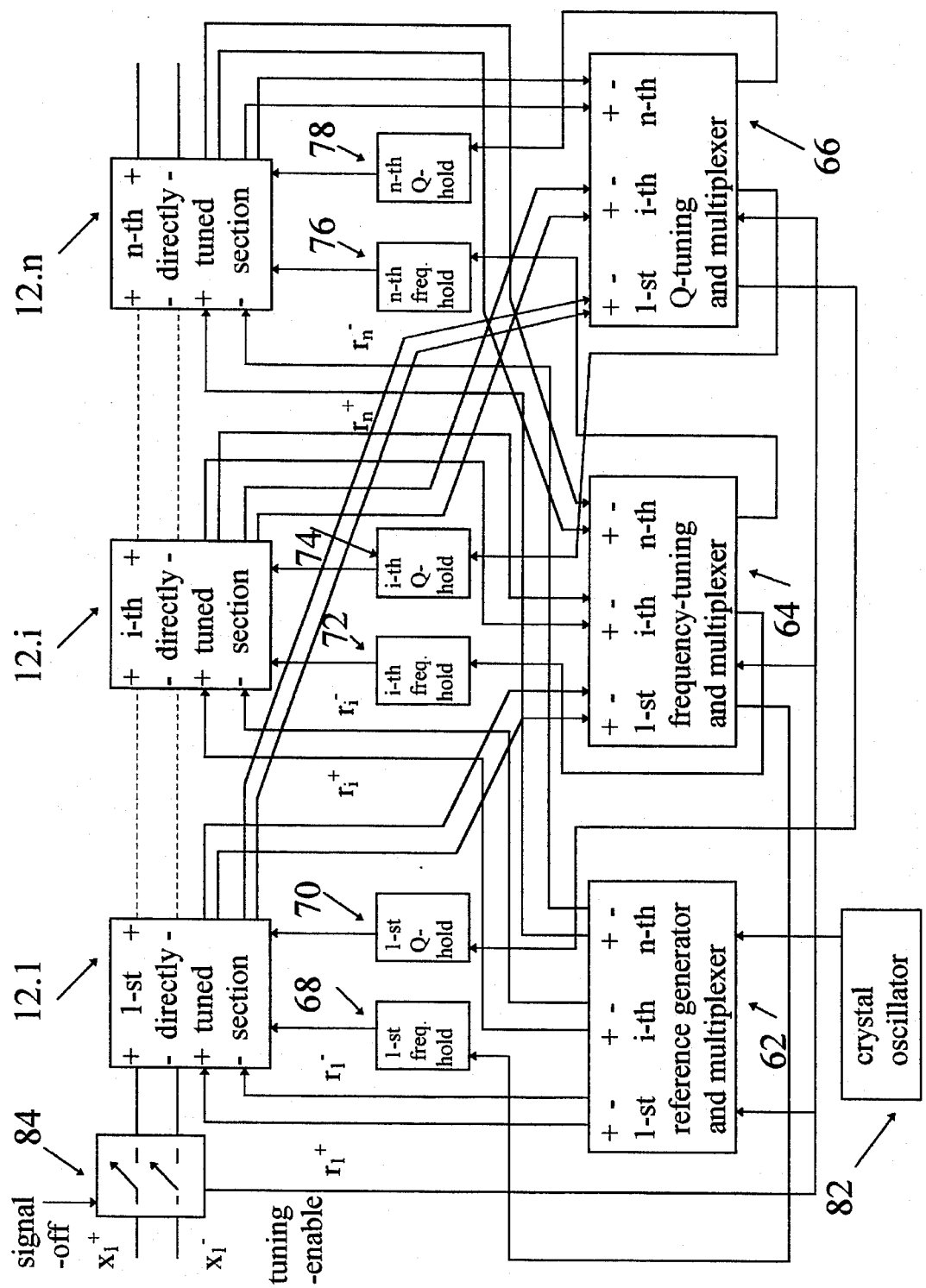
FIG. 8 is a block diagram of a filter arrangement of the present invention used for temporarily removing the filter from the signal path.

Yet another aspect of the present invention is to use a self-tuned filter to perform tuning during a period when the filter can be taken out of the system. The general scheme is illustrated in FIG. 8 which is similar to the filter of FIG. 6 with the addition of a switch 84 that disconnects and connects the input signal to the tuned filter. The advantage of self-tuning for this purpose is that each of the sections can be separately and accurately tuned, and that again no switches are necessary to reconfigure the filter for tuning.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A self-tuned, continuous-time filter receiving a differential input signal and generating a differential output signal, the filter comprising:

a plurality of tunable-filter sections;

each filter section having a differential input for receiving a differential reference signal and a differential input for receiving the filter differential input signal, the reference signal and input signal being received simultaneously by said tunable filter sections;

each filter section generating a low-pass output signal and a band-pass output signal;

means for combining said low-pass output signals of said filter sections and for generating a combined low-pass output signal;

means for combining said band-pass output signals of said filter sections and for generating a combined band-pass output signal;

a frequency-tuning circuit for receiving said combined low-pass output signal and for generating a tuning signal applied to said filter sections for frequency tuning said filter sections;

an Q-tuning circuit for receiving said combined band-pass output signal and for generating a tuning signal applied to said filter sections for amplitude tuning said filter sections; and means for removing the differential reference signal from said low-pass output signals of said filter sections to generate the filter differential output signal.

2. The filter of claim 1 wherein the differential reference signal is applied in-phase and the filter differential input signal is applied anti-phase to said filter sections.

3. The filter of claim 1 wherein said means for combining said low-pass output signals includes means for subtracting said low-pass output signals; and said means for combining said band-pass output signals includes means for subtracting said band-pass output signals.

4. The filter of claim 1 wherein the differential reference signal is applied anti-phase and the filter differential input signal is applied in-phase to said filter sections.

5. The filter of claim 1 wherein said means for combining said low-pass output signals includes means for summing said low-pass output signals; and said means for combining said band-pass output signals includes means for summing said band-pass output signals.

6. The filter of claim 1 wherein each of said tunable-filter sections includes a plurality of filter sections.

7. The filter of claim 1 and further including:

a multiplexer for applying said reference signal from a single source to each of said filter sections; and a signal generator for generating said tuning signals.

8. The filter of claim 1 and further including:

means for frequency tuning and means for Q-tuning during trimming of the filter.

9. The filter of claim 1 and further including:

switch means for selectively removing said input signal and for applying said reference signal to said filter sections, such that said reference signals are applied to said filter sections and pole frequencies and Q-factors are subsequently tuned.

10. A self-tuned, continuous-time filter receiving a differential input signal and generating a differential output signal, the filter comprising:

a plurality of tunable-filter sections;

each filter section having a differential input for receiving in-phase a differential reference signal and a differential input for receiving anti-phase the filter differential input signal, the reference signal and input signal being received simultaneously by said tunable filter sections;

each filter section generating a low-pass output signal and a band-pass output signal;

means for summing said low-pass output signals of said filter sections and for generating a combined low-pass output signal;

means for summing said band-pass output signals of said filter sections and for generating a combined band-pass output signal;

a frequency-tuning circuit for receiving said combined low-pass output signal and for generating a tuning signal applied to said filter sections for frequency tuning said filter sections;

an Q-tuning circuit for receiving said combined band-pass output signal and for generating a tuning signal applied to said filter sections for amplitude tuning said filter sections; and means for removing the differential reference signal by subtracting said low-pass output signals of said filter sections to generate the filter differential output signal.

11. The filter of claim 10 wherein each of said tunable-filter sections includes a plurality of filter sections.

12. The filter of claim 10 and further including:

a multiplexer for applying said reference signal from a single source to each of said filter sections; and a signal generator for generating said tuning signals.

13. The filter of claim 10 and further including:

means for frequency tuning and means for Q-tuning during trimming of the filter.

14. The filter of claim 10 and further including:

switch means for selectively removing said input signal and for applying said reference signal to said filter sections, such that said reference signals are applied to said filter sections and pole frequencies and Q-factors are subsequently tuned.

15. A self-tuned, continuous-time filter receiving a differential input signal and generating a differential output signal, the filter comprising:

a plurality of tunable-filter sections;

each filter section having a differential input for receiving anti-phase a differential reference signal and a differential input for receiving in-phase the filter differential input signal, the reference signal and input signal being received simultaneously by said tunable filter sections;

each filter section generating a low-pass output signal and a band-pass output signal;

means for subtracting said low-pass output signals of said filter sections and for generating a combined low-pass output signal;

means for subtracting said band-pass output signals of said filter sections and for generating a combined band-pass output signal;

a frequency-tuning circuit for receiving said combined low-pass output signal and for generating a tuning signal applied to said filter sections for frequency tuning said filter sections;

an Q-tuning circuit for receiving said combined band-pass output signal and for generating a tuning signal applied to said filter sections for amplitude tuning said filter sections; and means for removing the differential reference signal by summing said low-pass output signals of said filter sections to generate the filter differential output signal.

16. The filter of claim 15 wherein each of said tunable-filter sections includes a plurality of filter sections.

17. The filter of claim 15 and further including:

a multiplexer for applying said reference signal from a single source to each of said filter sections; and a signal generator for generating said tuning signals.

18. The filter of claim 15 and further including:

means for frequency tuning and means for Q-tuning during trimming of the filter.

19. The filter of claim 15 and further including:

switch means for selectively removing said input signal and for applying said reference signal to said filter sections, such that said reference signals are applied to said filter sections and pole frequencies and Q-factors are subsequently tuned.

* * * * *